(12) United States Patent
Xu et al.

(10) Patent No.: US 9,852,996 B2
(45) Date of Patent: Dec. 26, 2017

(54) SUBSTRATE AND METHOD FOR LABELING SIGNAL LINES THEREOF

(71) Applicants: Shanghai Tianma Micro-Electronics Co., Ltd, Shanghai (CN); Tianma Micro-Electronics Co., Ltd., Shenzhen (CN)

(72) Inventors: Wei Xu, Shanghai (CN); Zhaokeng Cao, Shanghai (CN); Yan Jia, Shanghai (CN); Xiangmin Tan, Shanghai (CN); Di Zhu, Shanghai (CN); Yinghua Mo, Shanghai (CN); Wenze Shan, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/288,351

(22) Filed: May 27, 2014

(65) Prior Publication Data
US 2015/0179585 A1 Jun. 25, 2015

(30) Foreign Application Priority Data

Dec. 24, 2013 (CN) .......................... 2013 1 0724480

(51) Int. Cl.
*H01L 27/14* (2006.01)
*H01L 29/04* (2006.01)
(Continued)

(52) U.S. Cl.
CPC .......... *H01L 23/544* (2013.01); *H01L 27/124* (2013.01); *H01L 27/1262* (2013.01); *H01L 2223/54406* (2013.01); *H01L 2223/54426* (2013.01); *H01L 2223/54433* (2013.01); *H01L 2223/54486* (2013.01); *H01L 2924/0002* (2013.01)

(58) Field of Classification Search
CPC ...................................................... H01L 23/544
USPC ........................................................... 257/72
See application file for complete search history.

(56) References Cited

U.S. PATENT DOCUMENTS

| | | | | |
|---|---|---|---|---|
| 2011/0089423 A1* | 4/2011 | Kwon | ................... | H01L 23/544 257/59 |
| 2013/0087934 A1* | 4/2013 | Kim | ..................... | H01L 27/1259 257/797 |
| 2014/0014907 A1* | 1/2014 | Jin | ...................... | H01L 27/3276 257/40 |

FOREIGN PATENT DOCUMENTS

| | | |
|---|---|---|
| CN | 101833201 A | 9/2010 |
| CN | 203786430 U | 8/2014 |

(Continued)

OTHER PUBLICATIONS

German Application No. 102014211404.7, First Office Action dated Aug. 24, 2017.

*Primary Examiner* — Hsin-Yi Hsieh
(74) *Attorney, Agent, or Firm* — Alston & Bird LLP

(57) ABSTRACT

A substrate is disclosed. The substrate includes a transparent underlayer, a plurality of signal lines on the transparent underlayer, and a plurality of labels on the transparent underlayer. The plurality of labels respectively correspond to the plurality of signal lines in a one-to-one relationship and are configured to identify the corresponding signal lines, and one of at least two adjacent labels is a forward pattern label, and another one of the at least two adjacent labels is a reverse pattern label.

19 Claims, 5 Drawing Sheets

(51) Int. Cl.
*H01L 29/15* (2006.01)
*H01L 31/036* (2006.01)
*H01L 23/544* (2006.01)
*H01L 27/12* (2006.01)

(56) References Cited

FOREIGN PATENT DOCUMENTS

| | | | |
|---|---|---|---|
| JP | 2002108241 | A | 4/2002 |
| KR | 1020040017638 | A | 2/2004 |
| KR | 20080107691 | A | 12/2008 |

\* cited by examiner

US 9,852,996 B2

SUBSTRATE AND METHOD FOR LABELING SIGNAL LINES THEREOF

CROSS REFERENCE TO RELATED APPLICATIONS

The present application claims priority of Chinese patent application No. 201310724480.1, filed on Dec. 24, 2013, and entitled "Substrate And Method For Labeling Signal Lines Thereof," the content of which is incorporated herein by reference in its entirety.

TECHNICAL FIELD

The present disclosure relates to the field of display devices, in particular to a substrate and a method for labeling signal lines thereof.

BACKGROUND OF THE INVENTION

A substrate of a display device is typically provided with signal lines, for example, a thin film transistor (TFT) array substrate of a liquid crystal display device is provided with data lines and scan lines. Generally, the signal lines in the substrate are labeled with labels such as digital sequence numbers, thereby identifying the signal lines during a manufacturing process of the liquid crystal display device, and accurately positioning each pixel during the subsequent test period.

FIG. 1 illustrates a schematic top view showing labels on a substrate in the prior art. As shown in FIG. 1, the substrate includes a transparent underlayer, a plurality of signal lines 10 formed on the underlayer, and a plurality of labels 11 respectively corresponding to each of the signal lines 10. The labels 11 are for example digital sequence numbers "1233", "1234", "1235" and "1236" as shown in FIG. 1 and used to identify each corresponding signal line.

FIGS. 2 and 3 are schematic diagrams showing the labels on the substrate in an array manufacturing process and in a cell manufacturing process, respectively. For example, in the case of the digital sequence number "1235" in the label 11, referring to FIG. 2, when the substrate is in the array manufacturing process, the substrate is placed in such a way that the labels thereof face upward, so that an forward pattern label "1235" is observed by an operator when the operator looks down at the digital sequence number "1235" in a direction from top side to bottom side. However, referring to FIG. 3, the substrate is placed upside down during the cell manufacturing process and hence the labels on the substrate face downward, so that a reverse pattern label 11 is observed by the operator when the operator looks down at the digital sequence number "1235" in a direction from top side to bottom side, that is, when the substrate is in the cell manufacturing process, the operator will see the reversed labels 11 of which a top side and a bottom side are presented upside down, thereby causing a difficulty in recognizing the labels and hence in recognizing the signal lines corresponding to the labels. Likewise, it is difficult to recognize other labels such as "1233", "1234" and "1236" and the signal lines corresponding thereto on the substrate in the prior art shown in FIG. 1, easily causing false recognition and hence mistakes.

BRIEF SUMMARY OF THE INVENTION

One inventive aspect is a substrate, including a transparent underlayer, a plurality of signal lines on the transparent underlayer, and a plurality of labels on the transparent underlayer. The plurality of labels respectively correspond to the plurality of signal lines in a one-to-one relationship and are configured to identify the corresponding signal lines, and one of at least two adjacent labels is a forward pattern label, and another one of the at least two adjacent labels is a reverse pattern label.

Another inventive aspect is a method for labeling signal lines in a substrate, where the substrate includes a transparent underlayer and a plurality of signal lines on the transparent underlayer. The method includes forming a plurality of labels on the transparent underlayer, where the plurality of labels respectively correspond to the plurality of signal lines in a one-to-one relationship and are configured to identify the corresponding signal lines. In addition, one of at least two adjacent labels is a forward pattern label, and another one of the at least two adjacent labels is a reverse pattern label.

DETAILED DESCRIPTION OF THE PREFERRED EMBODIMENTS

The present disclosure will be illustrated below further in detail with reference to the accompanying drawings and the embodiments. It will be appreciated that the specific embodiments described here are only used to explain the invention, rather than limiting the invention. It shall be further noted that, for convenience of description, the portions related to the present disclosure, rather than all of the present disclosure are shown in the accompanying drawings.

Figure 1:
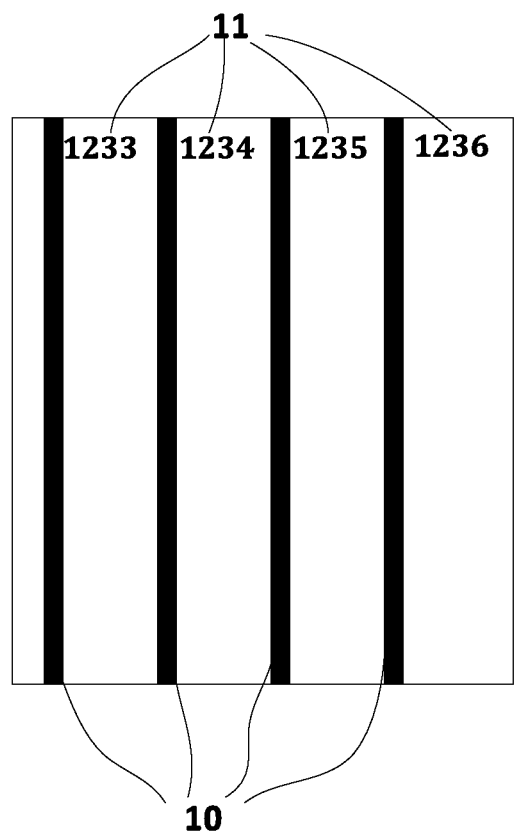
FIG. 1 is a schematic top view showing labels on the substrate in the prior art.
Figure 2:
FIG. 2 is a schematic diagram showing a label on a substrate in an array manufacturing process.
Figure 2:
Figure 3:
FIG. 3 is a schematic diagram showing the label on the substrate in a cell manufacturing process.
Figure 3:
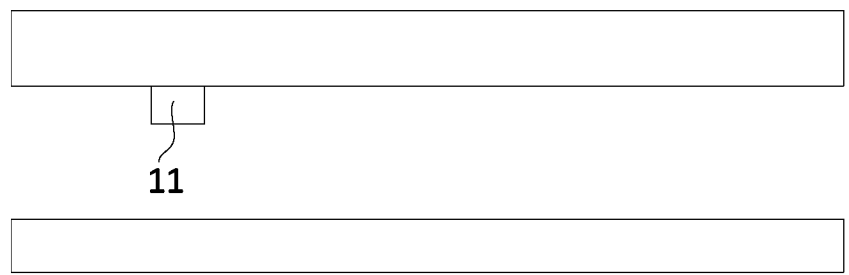
Figure 4:
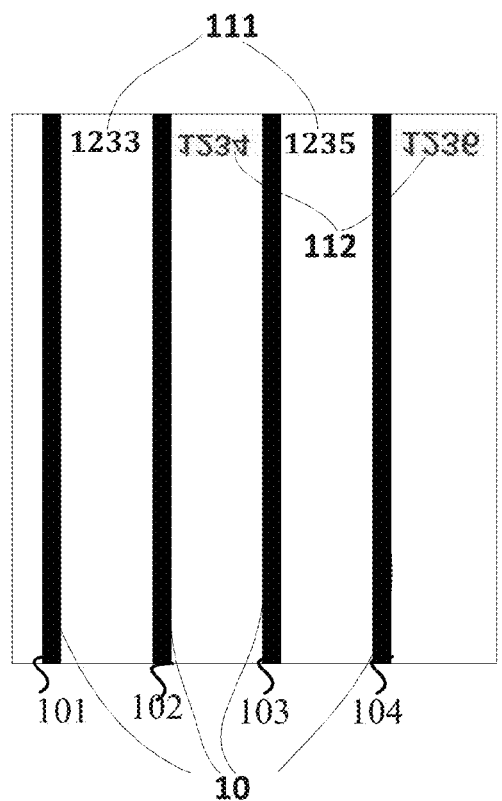
FIG. 4 illustrates a schematic top view of a substrate according to an embodiment of the present disclosure.
Figure 5:
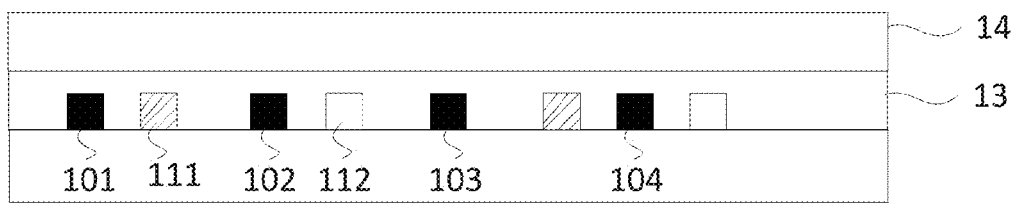
FIG. 5 illustrates a schematic side view of the substrate according to an embodiment of the present disclosure.

FIGS. 4 and 5 respectively illustrate a schematic top view and a schematic side view showing labels on a substrate according to an embodiment of the present disclosure. As shown in FIG. 4, the substrate of an embodiment includes a transparent underlayer, a plurality of signal lines 10 formed on the transparent underlayer and a plurality of labels 111 and 112 on the transparent underlayer. The plurality of labels 111, 112 correspond to the plurality of signal lines in a one-to-one relationship and are used to respectively identify the signal lines. One of at least two adjacent labels is a forward pattern label 111 such as "1233" or "1235", another one of the at least two adjacent labels is a reverse pattern label 112 such as "1234" or "1236". It should be noted that the term "one-to-one relationship" means that each signal line 10 is labeled with one digital sequence number, and the digital sequence numbers correspond to the signal lines, respectively.

When the substrate is in the array manufacturing process, sequential patterns "1233", "1234" "1235" and "1236" are observed by an operator when the operator looks down at the digital sequence numbers "1233", "1234", "1235" and "1236", that is, the forward pattern labels 111 (including the labels "1233" and "1235") for the signal lines can be clearly recognized in this case. Correspondingly, when the substrate is placed upside down in the cell manufacturing process, sequential patterns "1233" "1234", "1235" and "1236" are observed by an operator when the operator looks down at the digital sequence numbers "1233", "1234", "1235" and "1236", that is, the reverse pattern labels 112 (including the labels "1234" and "1236") for the signal lines can be clearly recognized in this case. Therefore, in an embodiment, since the labels include both of the forward pattern labels and the reverse pattern labels, the signal lines can be correctly identified by the operator through the forward pattern labels and the reverse forward pattern labels no matter the substrate is in the array manufacturing process or in the cell manufacturing process, thereby avoiding any problem caused by false recognition.

It should be noted that the pattern labels in FIG. 4 such as digital labels are demonstrative. Alternatively, the labels may be letters, or a combination of letters and numbers and so on, and the specific form of the labels are not limited in an embodiment, as long as labels which can be used for identification. Further, as shown in FIG. 4, the signal lines are labeled by digital labels increasing in a direction from left to right, or the digital labels may decrease in the direction from left to right. When the substrate is under operation, any digital sequence number which is not clear enough to recognize may be derived from the digital sequence numbers which are clear enough to recognize considering that the digital sequence numbers are arranged in an increasing or decreasing order, thereby identifying each signal line corresponding to the each digital sequence number on the substrate. For example, as shown in FIG. 4, when the substrate is in the array manufacturing process and the operator looks down at the substrate to see the labels from top side to bottom side, the digital sequence numbers which correspond to the signal lines 101 and 103 can be clearly recognized as "1233" and "1235", respectively. Since the digital sequence numbers are arranged in an increasing order from left to right in an embodiment, the digital sequence numbers which correspond to the signal lines 102 and 104 can be determined as "1234" and "1236" based on the digital sequence numbers which correspond to the signal lines 101 and 103. Of course, rules for making the labels may be defined in an agreement or convention in specific circumstances, and signal lines are labeled according to rules defined in the agreement or convention, which is not limited here.

Figure 6:
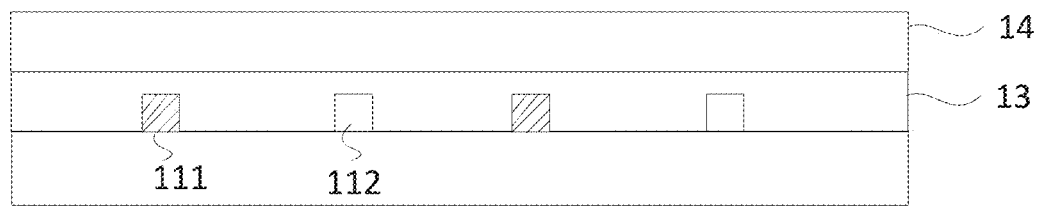
FIG. 6 illustrates a schematic diagram of labels on a substrate according to an embodiment of the present disclosure.

FIG. 6 illustrates a schematic diagram showing labels on a substrate according to an embodiment of the present disclosure. It should be noted that the labels in FIG. 6 are demonstrative, and signal lines are omitted in FIG. 6. Forward pattern labels 111 and reverse pattern labels 112 can be disposed on a same layer of the substrate. If the substrate is a TFT substrate, they may be in a gate layer 13 where a gate of a TFT switch in the TFT array substrate is located. It should be specially noted that the forward pattern labels 111 and the reverse pattern labels 112 may also be in a same layer as a drain and source layer 14 where a drain or a source of the TFT switch is located in an embodiment. If the substrate in an embodiment is a TFT array substrate, the signal lines may be data lines or scan lines, thus the forward pattern labels 111 on the substrate can include forward data line labels or forward scan line labels, and the reverse pattern labels 112 can include reverse data line labels or reverse scan line labels. As described above, if both the forward pattern labels 111 and the reverse pattern labels 112 are disposed on a same layer of the TFT array substrate, preferably, in an embodiment on a same layer as a gate or a drain and a source of the TFT switch may be located, therefore the forward pattern labels 111 and the reverse pattern labels 112 may be formed while the gate or the drain and the source of the TFT switch are formed, to simplify processing steps. It should be peculiarly noted that the TFT with a bottom-gate structure in FIG. 6 is just taken as an example, but shall not be construed as a limitation to the present disclosure. In an embodiment, both the forward pattern labels 111 and the reverse pattern labels 112 may be disposed on a same layer of the TFT array substrate which is different from the layer on which the gate or the drain and the source of the TFT switch may be disposed.

Alternatively, the forward pattern labels 111 and the reverse pattern labels 112 may be disposed on different layers of the substrate in an embodiment, for example, if the substrate of the present disclosure is a TFT array substrate, the forward pattern labels 111 and a gate of a TFT switch of the TFT array substrate may be formed in a same step, that is, the forward pattern labels 111 is formed on a same layer with the gate; and the reverse pattern labels 112 can be formed while forming a drain and a source of the TFT switch, that is, the reverse pattern labels 112 are disposed on a same layer as the drain and the source. Optionally, the forward pattern labels 111 and the reverse pattern labels 112 may be formed on different layers other than the layers on which the gate and the drain and the source are disposed. Optionally, the forward pattern labels 111 and the reverse pattern labels 112 are made of metal.

Figure 7:
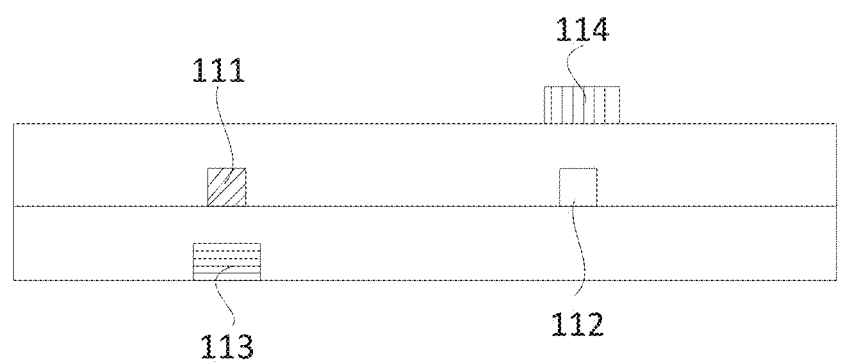
FIG. 7 illustrates a schematic diagram of a substrate according to an embodiment of the present disclosure.

FIG. 7 illustrates a schematic diagram of a substrate according to an embodiment of the present disclosure. The substrate further includes at least a forward barrier pattern 113 and at least a reverse barrier pattern 114. The forward barrier patterns 113 are disposed below the forward pattern labels 111 and are electrically insulated from the forward pattern labels 111. The reverse barrier patterns 114 are disposed above the reverse pattern labels 112 and are electrically insulated from the reverse pattern labels 112. Preferably, In an embodiment, the forward barrier patterns 113 and/or the reverse barrier patterns 114 are made of metal. The at least a forward barrier pattern 113 is configured to obscure the forward pattern labels 111 in a first direction, i.e. a direction from a back surface to a top surface of the substrate, so that the forward pattern labels 111 are invisible in the first direction, but the reverse pattern labels 112 are clearly recognizable in the first direction, so that the signal lines can be correctly and clearly identified through the reverse pattern labels 112. The at least a reverse barrier pattern 114 is configured to obscure the reverse pattern labels 112 in a second direction opposite to the first direction, i.e. a direction from the top surface to the bottom surface of the substrate, so that the reverse pattern labels 112 are invisible in the second direction, but the forward pattern labels 111 are clearly recognizable in the second direction.

It should be noted that in an embodiment, regardless of the layers on which the forward pattern labels or and the reverse pattern labels 112 are disposed, the at least a forward barrier pattern 113 is disposed below the forward pattern labels 111 and the at least a reverse barrier pattern 114 is disposed above the reverse pattern labels 112.

Figure 8:
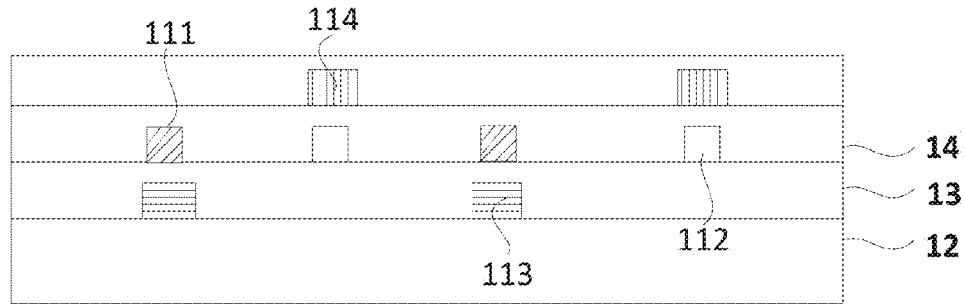
FIG. 8 illustrates a schematic diagram showing labels on a TFT array substrate with a bottom-gate structure according to an embodiment of the present disclosure.

FIG. 8 illustrates a schematic diagram showing labels on a TFT array substrate with a bottom-gate TFT structure in an embodiment. The substrate 12 is a TFT array substrate. The TFT array substrate includes a gate layer 13 and a drain and source layer 14 for the TFT switch. Due to the bottom-gate structure of the TFT switch, the gate layer 13 is below the drain and source layer 14. When the forward pattern labels 111 are disposed on a same layer as the reverse pattern labels 112, because the at least a forward barrier pattern 113 is required to be disposed below the forward pattern labels 111 and the at least a reverse barrier pattern 114 is required to be disposed above the reverse pattern labels 112, optionally, the forward pattern labels 111 and the reverse pattern labels 112 can be disposed on a same layer as the drain and source layer 14, and the at least a forward barrier pattern 113 is disposed on the gate layer 13 on which the gate of the TFT switch is located, and the at least a forward barrier pattern 113 is electrically insulated from the gate (not shown in FIG. 8). The at least a reverse barrier pattern 114 is formed above the reverse pattern labels 112 and is electrically insulated from the reverse pattern labels 112. In FIG. 8, the insulation is realized by various insulating layers. Optionally, the at least a forward barrier pattern 113 and the at least a reverse barrier pattern 114 can be made of metal. Further, the number of the forward pattern labels and the reverse pattern labels on the TFT array substrate is identical with the number of the labeled signal lines on the TFT array substrate.

Figure 9:
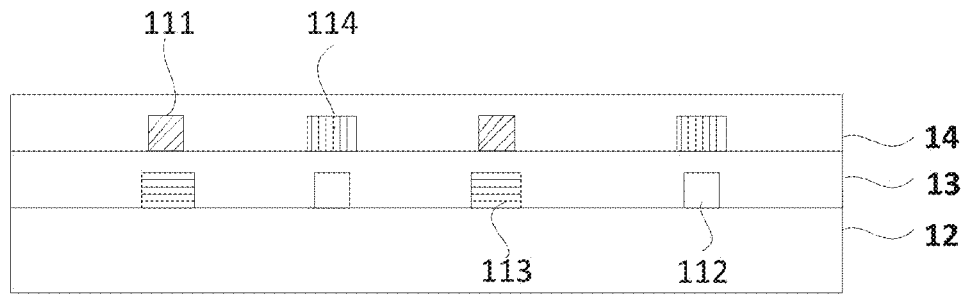
FIG. 9 illustrates a schematic diagram showing labels on a TFT array substrate with a bottom-gate structure according to an embodiment of the present disclosure.

Of course, the forward pattern labels 111 and the reverse pattern labels 112 may also be disposed on different layers of the TFT array substrate. As shown in FIG. 9, optionally, the forward pattern labels 111 and the at least a reverse barrier pattern 114 are disposed on the drain and source layer 14 on which the source or the drain of the TFT switch is located (with the forward pattern labels 111, the reverse barrier pattern 114 and the drain and source being electrically insulated from each other), and the forward barrier pattern 113 and the at least a reverse pattern labels 112 are disposed on the gate layer on which the gate (not shown in FIG. 9) of the TFT switch is located (with the forward barrier pattern 113, the reverse pattern labels 112 and the gate being electrically insulated from each other). Since the forward pattern labels 111, the reverse pattern labels 112, the forward barrier pattern 113 and the reverse barrier pattern 114 each may be formed in a same step as the drain and source (not shown in FIG. 9) or the gate (not shown in FIG. 9) of the TFT switch may be manufactured, the manufacturing process for the substrate of the present disclosure is effectively simplified.

Optionally, the TFT switch may be a top-gate TFT structure. The TFT switch with a top-gate structure may be in such a form that a gate layer on which a gate of the TFT is located is disposed below a drain and source layer on which a source or a drain of the TFT is located, or such a form that the gate layer is disposed above the drain and source layer. Optionally, when the forward pattern labels and the reverse pattern labels are disposed on a same layer which is one layer of the gate layer and the drain and source layer that is farther from the underlayer of the substrate, and the at least a forward barrier pattern can be formed on one layer of the gate layer and the drain and source layer that is closer to the underlayer. The at least a reverse barrier pattern is formed above the reverse pattern labels and is insulated from the reverse pattern labels.

Optionally, if the TFT switch has a top-gate TFT structure and the forward pattern labels and the reverse pattern labels are disposed on different layers, the forward pattern labels and the at least a reverse barrier pattern can be formed on one of the gate layer and the drain and source layer that is farther from the underlayer of the substrate, and the at least a forward barrier pattern and the reverse pattern labels can be formed on one of the gate layer and the drain and source layer that is closer to the underlayer.

In the present embodiment, the forward pattern labels are used to correctly identify the signal lines from the second direction, and the reverse pattern labels are used to correctly identify the signal lines from the first direction. The forward barrier pattern is used to obscure the forward pattern labels when an operator seeing in the first direction, and the reverse barrier pattern is used to obscure the reverse pattern labels when an operator seeing in the second direction. If the substrate of an embodiment is a TFT array substrate and when TFT switches of the TFT array substrate have different structures, in order to effectively identify the data lines and the scan lines on the substrate, the forward pattern labels, the reverse pattern labels, the forward barrier pattern and the reverse barrier pattern can be disposed at different positions or layers, so that the forward pattern labels and the reverse pattern labels may be clearly recognized to identify the signal lines.

Figure 10:
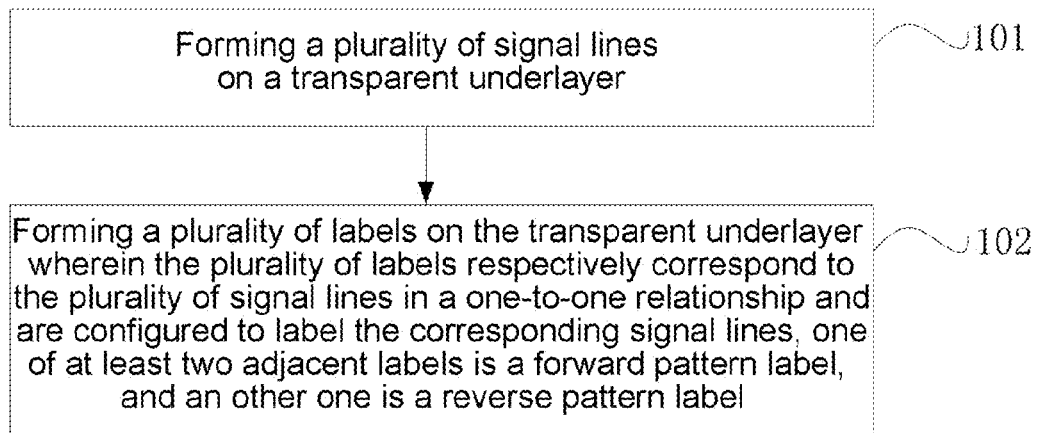
FIG. 10 illustrates a flow chart of a method for labeling signal lines in the substrate according to an embodiment of the present disclosure.

FIG. 10 illustrates a flow chart of a method for labeling signal lines in the substrate according to an embodiment of the present disclosure. As shown in FIG. 10, the method includes steps S101 to S102 as described below in detail.

At step 101, a plurality of signal lines are formed on a transparent underlayer.

The signal lines are formed on the transparent underlayer by photolithographic processes such as photoresist coating, exposure, development, and so on. For example, a plurality of data lines or a plurality of scan lines are formed on a TFT array substrate.

At step 102, a plurality of labels are formed on the transparent underlayer by photolithographic processes, where the plurality of labels respectively correspond to the plurality of signal lines in a one-to-one relationship and are used to label the corresponding signal lines, one of at least two adjacent labels is an forward pattern label, and another one is a reverse pattern label.

Optionally, the labels for the signal lines are formed in a decreasing or increasing order on the transparent underlayer of the substrate. That is, during the photolithographic processes, after the photoresist is patterned, a remained forward pattern and a remained reverse pattern which are made of photoresist may be arranged in a decreasing or increasing order, and then the forward pattern label or the reverse pattern label may be formed by the photolithographic process.

The forward pattern labels and the reverse pattern labels may be formed on a same layer or different layers. Preferably, in an embodiment, the forward pattern labels and the reverse pattern labels may be disposed alternately.

Preferably, in an embodiment, the forward pattern labels and/or the reverse pattern labels may be formed while forming the signal lines (including data lines or gate lines). Exemplarily, the substrate is a TFT array substrate, the forward pattern labels and/or the reverse pattern labels can be formed by photolithographic processes while forming the gate or the drain or the source of the TFT switch in the TFT array substrate. It should be noted that the forward pattern labels and the reverse pattern labels may also be formed on any other metal layer of the TFT array substrate in a step.

Further, the method for labeling the signal lines in the substrate can further include: forming at least a forward barrier pattern before the forward pattern labels are formed. Specifically, the at least a forward barrier pattern is formed on the transparent underlayer by photolithographic processes, then the forward pattern labels are formed above the at least a forward barrier pattern. The at least a forward barrier pattern is electrically insulated from the forward pattern labels (for example, by an insulating layer interposed between the at least a forward barrier pattern and the forward pattern labels), and the at least a forward barrier pattern obscures the forward pattern labels when an operator seeing in a first direction.

Optionally, the method for labeling the signal lines in the substrate can further include: forming at least a reverse barrier pattern after the reverse pattern labels are formed. Specifically, the reverse pattern labels are formed on the transparent underlayer by photolithographic processes, then the at least a reverse barrier pattern is formed above the reverse pattern labels. The at least a reverse barrier pattern is electrically insulated from the reverse pattern labels (for example, by an insulating layer interposed between the reverse pattern labels and the at least a reverse barrier pattern), and the at least a reverse barrier pattern obscures the reverse pattern labels when an operator seeing in a second direction.

Further, preferably, in one embodiment, the method for labeling the signal lines in the substrate of an embodiment corresponds to the substrate of the above-mentioned embodiments. Exemplarily, for example, a substrate of an embodiment is a TFT array substrate which may include TFT switches having a bottom-gate TFT structure, thus the method may correspondingly include: forming at least a forward barrier pattern by photolithographic processes while forming a gate of the TFT switch in the TFT array substrate; then, forming forward pattern labels and reverse pattern labels while forming a drain and a source of the TFT switch; and then forming at least a reverse barrier pattern above the drain and the source of the TFT switch.

Exemplarily, for example, a substrate of an embodiment is a TFT array substrate which may include TFT switches having a bottom-gate TFT structure, thus the method may correspondingly include: forming the at least a forward barrier pattern and reverse pattern labels by photolithographic processes while forming a gate of the TFT switch in the TFT array substrate; and then forming forward pattern labels and at least a reverse barrier pattern by photolithographic processes while forming a drain and a source of the TFT switch.

It should be noted that if the TFT switch of the TFT array substrate has a top-gate TFT structure, a person skilled in the art would appreciate that the method for labeling signal lines in the TFT array substrate including TFT switches having a top-gate structure differentiates from the above-described method merely by the relative positions between the gate and the drain and the source of the TFT switch, thus detailed description thereof will not be repeated here.

It should be noted that the description above has just explained some embodiments and the technical principle of the present disclosure. A person skilled in the art will appreciate that the present disclosure is not limited to the specific embodiment described above. Various obvious modifications, readjustment and equivalent alternative may be made by those skilled in the art without departing from the scope of the invention. Therefore, although the present disclosure has been described as above in combination with the preferable embodiments, the invention is not limited to these embodiments, and further equivalent embodiments can also be included without departing the spirit of the present disclosure. The scope of the present disclosure is defined by the appended claims.

What is claimed is:

1. A substrate, comprising:
   a transparent underlayer;
   a plurality of signal lines on the transparent underlayer; and
   a plurality of labels on the transparent underlayer next to the plurality of signal lines, wherein the plurality of labels respectively correspond to the plurality of signal lines in a one-to-one relationship and are configured to identify the corresponding signal lines,
   wherein the plurality of labels comprise a first label and a second label adjacent to the first label, the first label comprises a plurality of symbols, and the second label comprises a plurality of upside-down symbols which are upside-down mirror images of the plurality of symbols, at least one of the plurality of symbols being different from its upside-down mirror image.

2. The substrate of claim 1, wherein the plurality of symbols of the first label comprises a plurality of numeric characters and the plurality of upside-down symbols of the second label are logically associated.

3. The substrate of claim 1, further comprising:
   a first barrier pattern disposed between the first label and the transparent underlayer, wherein the first barrier pattern is electrically insulated from the first label; and
   a second barrier pattern disposed above the second label, wherein the second barrier pattern is electrically insulated from the second label,
   wherein the first barrier pattern is configured to obscure the first label in a first direction, and the second barrier pattern is configured to obscure the second label in a second direction which is opposite to the first direction.

4. The substrate of claim 3, wherein the plurality of labels comprise metal.

5. The substrate of claim 1, wherein the first label and the second label are on a same layer.

6. The substrate of claim 5, wherein the substrate is a TFT array substrate comprising a TFT switch, the TFT switch comprises a gate, a source and a drain,
   wherein the plurality of labels and the gate of the TFT switch are on a same layer, or
   wherein the plurality of labels and the source and drain of the TFT switch are on a same layer.

7. The substrate of claim 3, further comprising a TFT switch having a bottom-gate structure, a gate, a source and a drain,
   wherein the plurality of labels and the source and drain of the TFT switch are patterned on a same layer, and wherein the first barrier pattern is patterned on a same layer as the gate of the TFT switch.

8. The substrate of claim 3, further comprising a TFT switch having a bottom-gate structure, a gate, a source and a drain,
   wherein the first label and the second barrier pattern are patterned on a same layer as the source and drain of the TFT switch, wherein the second label and the first barrier pattern are patterned on a same layer as the gate of the TFT switch is.

9. The substrate of claim 3, further comprising a TFT switch having a top-gate structure, a gate, a source and a drain,
wherein the plurality of labels are formed on a same layer as the gate of the TFT switch, and wherein the first barrier pattern is formed on a same layer as the source and drain of the TFT switch.

10. The substrate of claim 3, further comprising a TFT switch having a top-gate structure, a gate, a source and a drain,
wherein the first label and the second barrier pattern are on a same layer as the gate of the TFT switch, and wherein the second label and the first barrier pattern are on a same layer as the source and drain of the TFT switch.

11. A method for labeling signal lines in a substrate, wherein the substrate comprises a transparent underlayer and a plurality of signal lines on the transparent underlayer, wherein the method comprises:
forming a plurality of labels on the transparent underlayer next to the plurality of signal lines, wherein the plurality of labels respectively correspond to the plurality of signal lines in a one-to-one relationship and are configured to identify the corresponding signal lines,
wherein the plurality of labels comprises a first label and a second label adjacent to the first label, the first label comprise a plurality of symbols, and the second label comprises a plurality of upside-down symbols which are upside-down mirror images of the plurality of symbols, at least one of the plurality of symbols being different from its upside-down mirror image.

12. The method of claim 11, wherein the plurality of symbols of the first label comprises a plurality of numeric characters and the plurality of upside-down symbols of the second label are logically associated.

13. The method of claim 12, wherein the substrate is a TFT array substrate, and the method further comprises:
forming the first label and the second label in a gate layer while forming a gate of a TFT switch; or
forming the first label and the second label in a source/drain layer while forming a drain and a source of the TFT switch.

14. The method of claim 11, further comprising:
forming a first barrier pattern on the transparent substrate; and
subsequently forming the first label above the first barrier pattern, wherein the first barrier pattern is electrically insulated from the first label,
wherein the first barrier pattern obscures the first label in a first direction.

15. The method of claim 11, further comprising:
forming the second label on the transparent substrate; and
subsequently forming a second barrier pattern above the second label, wherein the second barrier pattern is electrically insulated from the second label, and
wherein the second barrier pattern obscures the second label in a second direction.

16. The method of claim 11, wherein the first label and the second label are formed on different layers.

17. The substrate of claim 1, wherein the first label and the second label are on different layers.

18. The substrate of claim 1, wherein one of the signal lines identifiable by the first label is adjacent to another one of the signal lines identifiable by the second label.

19. The substrate of claim 1, wherein the plurality of symbols of the first label comprise numeric characters, and letters which are different from their upside-down mirror images.

* * * * *